United States Patent [19]
Alexander et al.

[11] Patent Number: 5,929,662
[45] Date of Patent: Jul. 27, 1999

[54] ANALOG COMPARATOR AND METHOD

[75] Inventors: Daniel D. Alexander, Gilbert; David J. Anderson, Scottsdale, both of Ariz.

[73] Assignee: Motorola, Inc., Schaumburg, Ill.

[21] Appl. No.: 08/963,627

[22] Filed: Nov. 4, 1997

[51] Int. Cl.[6] .............................. H03K 5/22; H03K 3/02; H03K 3/037

[52] U.S. Cl. ............................ 327/67; 327/65; 327/198; 327/215

[58] Field of Search ..................................... 327/142, 143, 327/198, 199, 202, 203, 208, 210, 214, 215, 63, 64, 65, 67, 77, 87

[56] References Cited

U.S. PATENT DOCUMENTS

| | | | |
|---|---|---|---|
| 5,173,870 | 12/1992 | Sukashita et al. | 327/208 |
| 5,486,785 | 1/1996 | Blankenship | 327/306 |
| 5,488,320 | 1/1996 | Carvella et al. | 327/203 |
| 5,546,028 | 8/1996 | Yamaguchi | 327/64 |
| 5,635,864 | 6/1997 | Jones | 327/77 |
| 5,825,220 | 10/1998 | Kinugasa et al. | 327/143 |

*Primary Examiner*—Toan Tran
*Attorney, Agent, or Firm*—Anthony M. Martinez

[57] ABSTRACT

A comparator (12) and method compare first and second signals ($V_{IN+}$, $V_{IN-}$) to provide an output signal ($V_O$, $V_{OB}$). A transistor (43) couples a supply terminal (64, 66) of the comparator to a power supply ($V_{DD}$) to enable the comparator for comparing the first and second signals. When the output signal is valid, it turns off the transistor to isolates the supply terminal from the power supply. As a result, power is reduced and a change in the first and second signals is prevented from changing the output signal. When the transistor turns off, a charge is trapped on the supply terminal that unbalances the comparator and causes a comparison error. A balanced condition is restored with a discharge circuit (31-33) coupled to the supply terminal to alter the charge when a control signal (RESET) is applied.

22 Claims, 2 Drawing Sheets

ANALOG COMPARATOR AND METHOD

BACKGROUND OF THE INVENTION

The present invention relates in general to integrated circuits and, more particularly, to comparator circuits used in programmable analog arrays.

Programmable analog arrays are integrated circuits that include a plurality of programmable analog cells for performing analog signal processing operations such as amplifying, filtering, etc., on analog signals. The analog signals are transferred among the programmable analog cells on programmable interconnect paths formed in routing channels between adjacent cells.

Programmable analog cells and other analog circuits often have a need to determine whether an analog signal has a magnitude greater than a reference or another analog signal. These determinations typically are made using comparators. In circuits such as analog to digital converters where small voltage differences must be resolved to produce a large digital output signal, a high gain is needed. As a result, the comparators often are configured with positive feedback to operate as a latch, which provides the ability to store the comparison result for later use. The accuracy of the comparison is limited by the accuracy of the comparator.

Because a latch retains its previous state, it must be reset before another comparison can be made. Prior art comparators reset the latch after removing its power supply. However, when power is removed, charges stored from a preceding comparison can be trapped on nodes of the comparator. The trapped charges unbalance the comparator and cause comparison errors during a subsequent comparison cycle.

Hence, there is a need for a circuit and method of comparing analog signals which conserves power but which does not result in charges being trapped to unbalance the comparator and produce comparison errors.

DETAILED DESCRIPTION OF THE DRAWINGS

Figure 1:
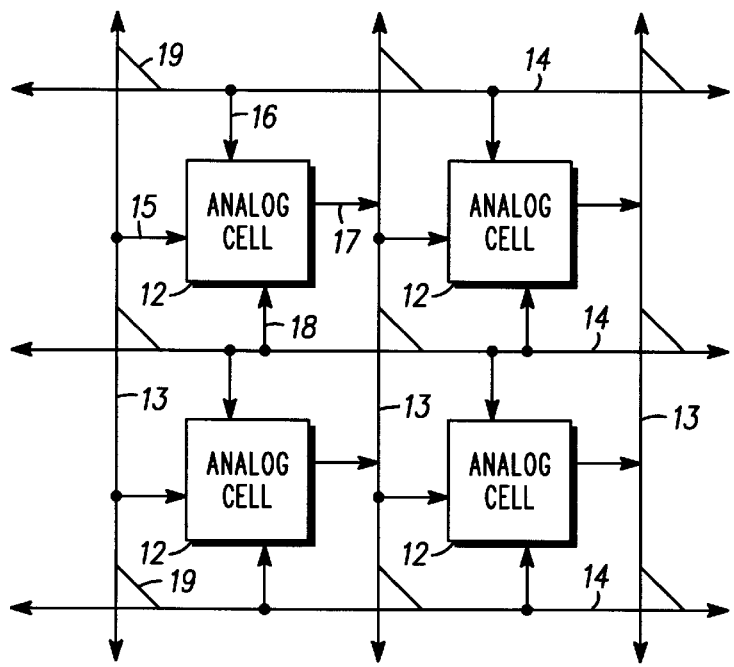
FIG. 1 is a block diagram of a programmable analog array.

FIG. 1 is a block diagram of a programmable analog array 10 in an integrated circuit configuration. Analog array 10 includes a plurality of programmable analog cells 12 arranged along a plurality of interconnect channels that form a switching network which includes bus lines 13 and 14 for routing analog or digital signals among analog cells 12 by means of analog switching devices such as transmission gates (not shown) through which the signals can be transferred with little or no distortion. In one embodiment, input signals are received on input terminals 15 and 16 and output signals are produced on output terminals 17 and 18. Signal routing between bus 13 and bus 14 is provided by switching devices 19. Buses 13 and 14 also include power supply conductors for routing power supply voltages $V_{DD}$=5.0 volts and ground potential to analog cells 12.

The operating characteristics of a particular analog cell 12 are determined by switching devices within the cell which interconnect cell components to produce a desired circuit configuration. Control over the switching devices is provided by binary control signals that may be stored in a memory such as random access memory (RAM) or read-only memory, or may be provided externally.

Analog cells 12 include various analog circuits, including comparators. The absolute values of circuit elements in analog comparators are not well controlled in integrated circuit fabrication processes, but a high degree of matching accuracy can be attained if the elements are carefully laid out on the die. In particular, comparators use matched input stages to attain a small input offset, which allows small differences between input signals to accurately be resolved.

In the figures, elements having the same reference number provide similar functions.

Figure 2:
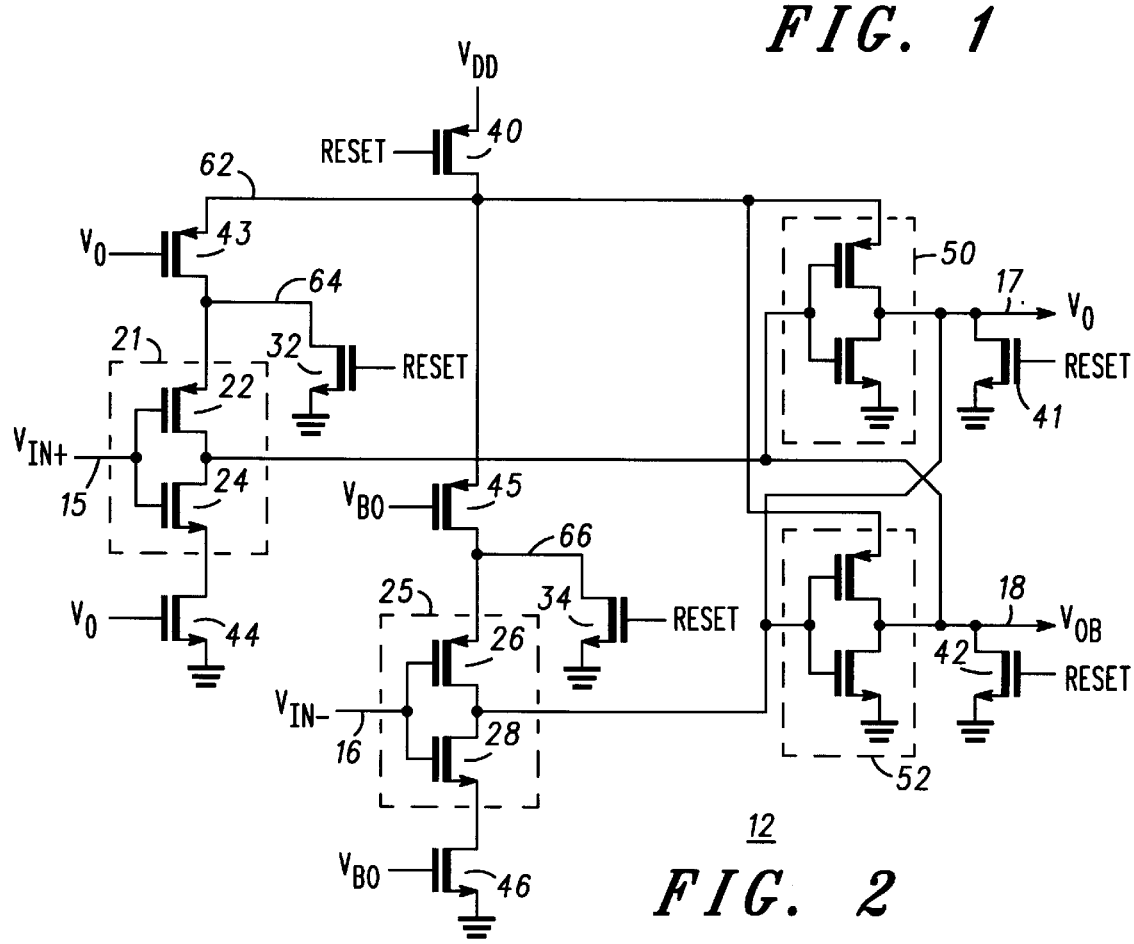
FIG. 2 is a schematic diagram of an analog comparator.

FIG. 2 is a schematic diagram of an analog cell 12 operating as a comparator for comparing analog input signals $V_{IN+}$ and $V_{IN-}$ to produce complementary digital output signals $V_O$ and $V_{OB}$. After a comparison is made, comparator 12 latches $V_O$ and $V_{OB}$ until being reset by a control signal RESET, after which a new comparison can be made. By alternating between compare and reset cycles, comparator 12 is ideally suited for use in clocked systems.

Comparator 12 includes an amplifier stage 21 comprising transistors 22 and 24 and an amplifier stage 25 comprising transistors 26 and 28, which are matched in accordance with standard integrated circuit layout practices. Comparator 12 further comprises a discharge circuit including transistors 32 and 34, a reset circuit including transistors 40, 41 and 42, and a power reduction circuit that includes transistors 43, 44, 45 and 46. Inverters 50 and 52 are cross coupled to operate as a latch.

Transistors are understood to provide a conduction path between first and second conduction electrodes which can be modified by a control signal applied to a control electrode. For example, the first and second conduction electrodes typically correspond to the source and drain of a metal-oxide-semiconductor (MOS) transistor. A channel of the MOS transistor provides a conduction path between the source and drain, and the gate of the MOS transistor operates as the control electrode.

Before a comparison of $V_{IN+}$ and $V_{IN-}$ is made, comparator 12 is initialized by a RESET pulse which turns off transistor 40 to isolate comparator 12 from power supply conductor 70 operating at a power supply voltage $V_{DD}$=5.0 volts. The isolation of inverters 50 and 52 from $V_{DD}$ effectively disables the operation of inverters 50–52, including the latching function. Inverters 50–52 are initialized by applying RESET to turn on transistors 41–42 to pull output signals $V_O$ and $V_{OB}$ to ground potential.

When RESET is removed, transistor 40 turns on to couple $V_{DD}$ through transistors 40, 43 and 45 so that nodes 64 and 66 operate as power supply terminals of comparator 12 to activate or enable amplifier stages 21 and 25. Transistors 41 and 42 turn off, releasing outputs 17–18 to charge up to their final potentials as inverters 50–52 latch in response to input signals $V_{IN+}$ and $V_{IN-}$. Transistors 43 and 45 remain turned on to couple $V_{DD}$ to nodes 64 and 66 until outputs 17–18 reach their final states.

While transistors 43 and 45 remain turned on after RESET terminates, input signals $V_{IN+}$ and $V_{IN-}$ are received at nodes 15 and 16 from the programmable switching network. $V_{IN+}$ and $V_{IN-}$ typically are centered at 2.5 volts, the midpoint between $V_{DD}$=5.0 volts and ground potential. Therefore, transistors 22 and 24 are both turned on and provide a conduction path between $V_{DD}$ and ground. The difference between $V_{IN+}$ and $V_{IN-}$ can be on the order of 1.0 millivolts or less.

Detailed operation is as follows. Assume that $V_{IN+}$ is more positive than $V_{IN-}$. Amplifier stages 21 and 25 are inverting stages, so node 18 tends to be more negative than node 17 because $V_{IN+}$ is more positive than $V_{IN-}$. Therefore, as RESET is removed and nodes 17 and 18 charge up, node 18 has a lower potential than node 17, so that inverter 52 begins to turn on before inverter 50. Positive feedback through cross coupled inverters 50–52 further reduces the potential on node 18, turning off inverter 50 and turning on inverter 52. Hence, inverters 50–52 latch to produce output signals $V_O$ and $V_{OB}$ at voltages substantially equal to $V_{DD}$ and ground, respectively.

Note that while transistor 43 is turned on, node 64 operates as a power supply terminal that allows current to flow through the conduction path formed by transistors 22–24 of amplifier stage 21. As $V_O$ rises, transistor 44 turns on to provide a conduction path from transistor 24 and ground. To conserve power, when $V_O$ charges to within a conduction threshold level of $V_{DD}$, transistor 43 turns off, isolating node 64 from the $V_{DD}$ power supply conductor and disabling the conduction path from $V_{DD}$ to amplifier stage 21 to reduce power consumption. Because $V_{OB}$ is at a low level, transistor 46 is turned off, which disables amplifier 25. As amplifiers 21 and 25 are both disabled, $V_{IN+}$ and $V_{IN-}$ changes are prevented from changing the latched state of inverters 50–52.

Comparator 12 operates similarly when $V_{IN+}$ is more negative than $V_{IN-}$, except that after RESET is removed, node 17 charges more slowly than node 18. Inverter 50 begins to turn on before inverter 52, and positive feedback through cross coupled inverters 50–52 further reduces the potential of node 17 and increases the potential of node 18. Hence, inverters 50–52 latch to produce output signals $V_O$ and $V_{OB}$ at voltage levels substantially equal to ground and $V_{DD}$, respectively.

While transistor 45 is turned on, node 66 operates as a power supply terminal that allows current to flow through transistors 26–28 of amplifier stage 25. As $V_{OB}$ rises, transistor 46 turns on to provide a conduction path from transistor 28 to ground. However, as $V_{OB}$ increases to within a conduction threshold level of $V_{DD}$, transistor 45 turns off to isolate node 66 from $V_{DD}$ and to disable conduction from $V_{DD}$ to ground through amplifier stage 25. Hence, current stops flowing through transistors 26–28, thereby reducing power consumption. Once node 66 is isolated from power supply $V_{DD}$, amplifier stage 25 is disabled, which prevents changes $V_{IN+}$ and $V_{IN-}$ from changing the latched state of inverters 50–52.

While transistors 43 and 45 are turned on and amplifier stages 21 and 25 are enabled, nodes 64 and 66 charge to potentials that track the voltage difference between $V_{IN+}$ and $V_{IN-}$ but are level shifted by the amount of the conduction thresholds of transistors 22 and 26, respectively. In other words, the voltage difference between $V_{IN+}$ and $V_{IN-}$ substantially appears across nodes 64 and 66. When RESET is asserted, transistor 40 turns off, trapping these charges and maintaining the voltage difference between nodes 64–66. When RESET is removed for a new comparison, nodes 64–66 begin charging from different voltages and at different rates. In particular, if node 64 is charged to a higher potential than node 66, node 64 remains at a higher potential as nodes 64–66 charge up, and vice versa. Therefore, amplifier 21 will tend to conduct before amplifier 25, thereby effectively introducing an offset which unbalances comparator 12 and produces comparison errors.

As a feature of the present invention, the offset described above is removed and balance restored to amplifier stages 21 and 25 by discharging the stored charges on nodes 64 and 66 during RESET through transistors 32 and 34 to a ground conductor or other discharge node. When RESET is removed and a new comparison is made, nodes 64 and 66 charge up from equal potentials to balance comparator 12 and prevent comparison errors.

Figure 3:
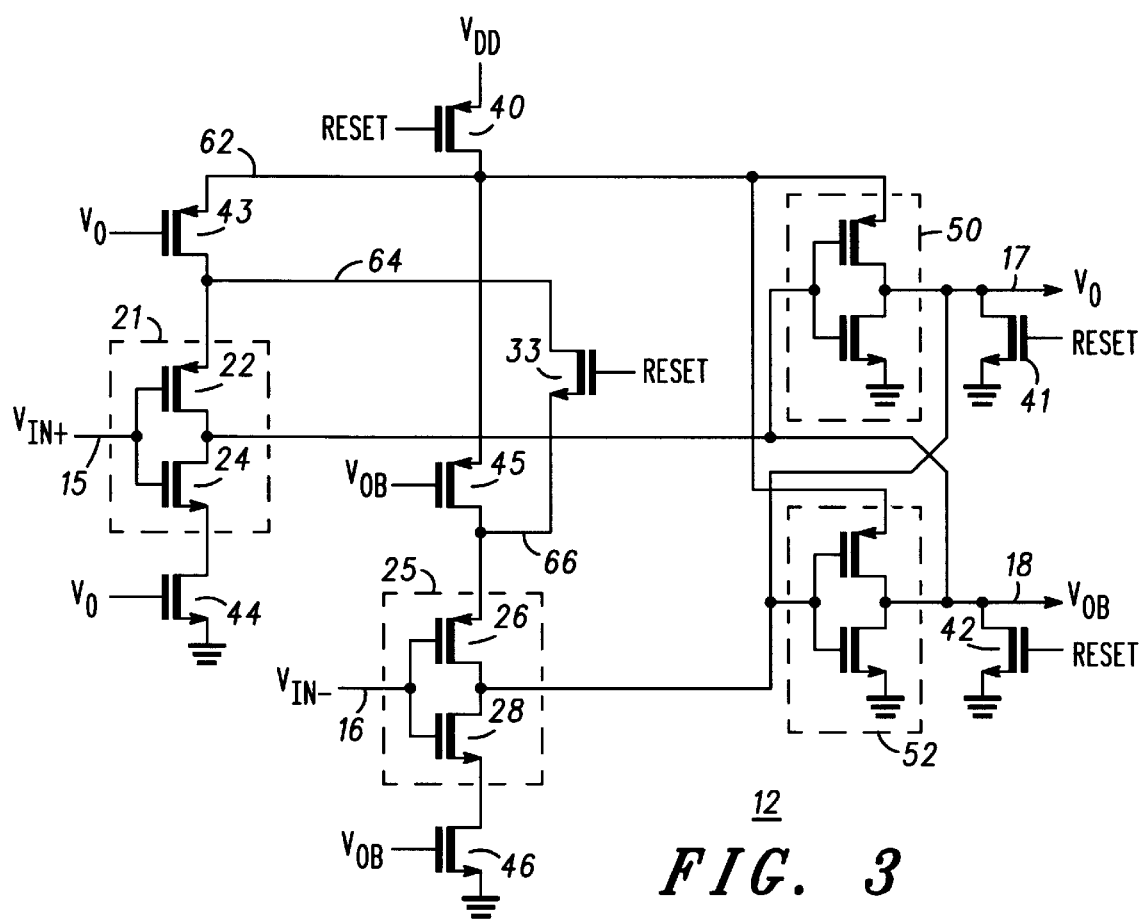
FIG. 3 is a schematic diagram of an alternate embodiment of an analog comparator.

FIG. 3 is a schematic diagram of comparator 12 in an alternate embodiment. Comparator 12 includes amplifier stages 21 and 25, which are matched as described in FIG. 2. Comparator 12 further comprises a reset circuit including transistors 40, 41 and 42, a power reduction circuit that includes transistors 43, 44, 45 and 46, and a storage circuit including inverters 50 and 52 which are cross coupled to operate as a latch. A discharge circuit includes transistor 33 replacing transistors 32 and 34 of the embodiment shown in FIG. 2.

The operation of comparator 12 is similar to what is shown and described in FIG. 2, except for the discharge circuit, which operates as follows. Rather than discharging nodes 64 and 66 to a discharge node to equalize their potentials, transistor 33 is used to provide a conduction path between nodes 64 and 66 when RESET is applied to the gate of transistor 33 to alter the stored charges on nodes 64 and 66. Hence, the stored charges flow between nodes 64–66 in a direction to equalize the potentials of nodes 64 and 66 and restore amplifier stages to a balanced condition for performing a new comparison.

By now it should be appreciated that the present invention provides a comparator and method of comparing first and second signals to provide an output signal. A conduction path couples a supply terminal of the comparator to a power supply to power up the comparator for comparing the first and second signals. When the output signal is produced, the conduction path is disabled by the output signal to isolate the supply terminal from the power supply, which reduces power in the comparator and prevents changes in the first and second signals from changing the output signal. When the conduction path is disabled, a charge is trapped on the supply terminal that unbalances the comparator and causes an error when a new comparison is made. Balance is restored with a discharge circuit coupled to the supply terminal which alters the charge when a reset signal is applied.

What is claimed is:

1. A comparator operating in response to first and second input signals for providing an output signal, comprising:
   a first conduction path (43) coupled between a power supply conductor (70) and a first supply terminal (64) of the comparator, where the first conduction path is disabled in response to the output signal ($V_O$) to isolate the first supply terminal from the power supply conductor; and
   a discharge circuit (32) coupled to the first supply terminal of the comparator for altering a stored charge in response to a control signal (RESET).

2. The comparator of claim 1, wherein the discharge circuit includes a second conduction path (32) coupled between the first supply terminal and a discharge node, and enabled with the control signal.

3. The comparator of claim 1, further comprising:
   an amplifier stage (21) coupled for receiving a power supply voltage at the first supply terminal and having first and second inputs coupled for receiving the first and second signals; and
   a storage circuit (50-52) having a first input coupled to a first output of the amplifier stage and a first output for providing the output signal.

4. The comparator of claim 3, wherein the storage circuit includes a latch having an input coupled to the first output of the amplifier stage and an output for providing the output.

5. The comparator of claim 3, wherein the amplifier stage includes:

a first inverter (21) receiving the power supply voltage from the first supply terminal, and having an input responsive to the first input signal and an output coupled to the first input of the storage circuit; and a second inverter (25) receiving the power supply voltage from a second supply terminal (66) and having an input responsive to the second input signal and an output coupled to a second input of the storage circuit.

6. The comparator of claim 5, wherein the storage circuit has a second output for providing a complementary output signal.

7. The comparator of claim 6, further comprising a second conduction path (45) coupled between the power supply conductor and the second supply terminal, where the second conduction path is disabled in response to the complementary output signal to isolate the second supply terminal from the power supply conductor.

8. The comparator of claim 7, wherein
the first conduction path includes a first transistor having a control electrode responsive to the output signal, and first and second conduction electrodes respectively coupled to the first supply terminal and the power supply conductor; and
the second conduction path includes a second transistor having a control electrode responsive to the complementary output signal, and first and second conduction electrodes respectively coupled to the second supply terminal and the power supply conductor.

9. The comparator of claim 5, wherein the discharge circuit includes:
a second conduction path (32) coupled between the first supply terminal and a discharge node (ground), and enabled with the control signal (RESET); and
a third conduction path (34) coupled between the second supply terminal and the discharge node, and enabled with the control signal.

10. The comparator of claim 5, wherein the discharge circuit includes a second conduction path (33) coupled between the first and second supply terminals, and enabled with the control signal.

11. The comparator of claim 7, further comprising a third conduction path (40) coupled between the power supply conductor and a common node (62) of the first and second conduction paths for biasing the comparator to a power supply voltage, where the third conduction path is disabled in response to the control signal to isolate the power supply voltage from the common node.

12. An integrated circuit, comprising a programmable analog array that includes a plurality of programmable analog cells operating from a power supply voltage and interconnected by a programmable switching network, where one of the plurality of programmable analog cells includes a comparator coupled for receiving first and second signals from the programmable switching network to produce an output signal, the comparator comprising:
a first conduction path coupled between a power supply conductor and a first supply terminal of the comparator, where the first conduction path is disabled in response to the output signal to isolate the first supply terminal from the power supply conductor; and
a discharge circuit coupled to the first supply terminal of the comparator for altering a stored charge in response to a control signal.

13. The integrated circuit of claim 12, wherein the comparator further comprises:
an amplifier coupled to the first supply terminal and having first and second inputs coupled for receiving the first and second signals; and a latch having an input coupled to an output of the amplifier and an output for providing the output signal.

14. The integrated circuit of claim 13, wherein the amplifier includes:
a first inverter coupled for receiving a power supply voltage from the first supply terminal and having an input responsive to the first signal and an output coupled to the first input of the latch; and
a second inverter coupled for receiving the power supply voltage from a second supply terminal of the comparator, and having an input responsive to the second signal and an output coupled to a second input of the latch.

15. The integrated circuit of claim 14, wherein the latch has a second output for providing a complementary output signal, further comprising a second conduction path coupled between the power supply conductor and the second supply terminal, where the second conduction path is disabled in response to the complementary output signal to isolate the second supply terminal from the power supply conductor.

16. The integrated circuit of claim 14, wherein the discharge circuit includes:
a third conduction path operating in response to the control signal for coupling the first supply terminal to a discharge node of the comparator; and
a fourth conduction path operating in response to the control signal for coupling the second supply terminal to the discharge node.

17. A method of comparing first and second signals, comprising the steps of:
biasing a first supply terminal of a comparator to a power supply voltage for comparing the first and second signals to provide an output signal;
isolating the first supply terminal from the power supply voltage with the output signal; and
altering a stored charge of the first supply terminal with a control signal.

18. The method of claim 17, wherein the step of isolating includes the step of disabling a first conduction path to block the power supply voltage.

19. The method of claim 18, wherein the step of altering includes the step of enabling a second conduction path from the first supply terminal to a common node.

20. The method of claim 17, further comprising the steps of:
amplifying the first and second signals to produce a comparison signal; and
latching the comparison signal to produce the output signal and a complementary output signal.

21. The method of claim 20, further comprising the steps of:
biasing a second supply terminal of the comparator to the power supply voltage;
isolating the second supply terminal from the power supply voltage with the complementary output signal; and
altering a stored charge of the second supply terminal with the control signal.

22. The method of claim 21, wherein the step of altering the stored charge of the second supply terminal includes the step of enabling a conduction path between the first and second supply terminals.

* * * * *